(12) United States Patent
Su

(10) Patent No.: US 6,933,178 B1
(45) Date of Patent: Aug. 23, 2005

(54) METHOD OF MANUFACTURING SEMICONDUCTOR PACKAGES AND A CLAMPING DEVICE FOR MANUFACTURING A SEMICONDUCTOR PACKAGE

(75) Inventor: Huan-Ping Su, Hsin-Chu (TW)

(73) Assignee: Ultratera Corporation, (CN)

( * ) Notice: Subject to any disclaimer, the term of this patent is extended or adjusted under 35 U.S.C. 154(b) by 0 days.

(21) Appl. No.: 10/829,411

(22) Filed: Apr. 20, 2004

(51) Int. Cl.[7] .............................................. H01L 21/44
(52) U.S. Cl. ...................... 438/126; 438/127; 438/106; 438/113
(58) Field of Search ............................... 438/126–127, 438/106, 113

(56) References Cited

U.S. PATENT DOCUMENTS 6,324,069 B1 * 11/2001 Weber ........................ 361/783

* cited by examiner

Primary Examiner—Luan Thai
(74) Attorney, Agent, or Firm—Anderson Kill & Olick, PC

(57) ABSTRACT

A method of manufacturing semiconductor packages is proposed. A die carrier is provided having a plurality of substrate units. At least one semiconductor die is mounted on each substrate unit by an adhesive. Then the die carrier mounted with the dies is cured in a jig fixture. The jig fixture has a submold and at least one exhaust passage communicated with an external exhauster. Air in the jig fixture is drawn out by the external exhauster through the exhaust passage to form a negative-pressure environment in the jig fixture. The negative-pressure environment generates an attraction force to secure the dies to the submold and counteract thermal stresses produced in the die carrier, thereby preventing die cracking, warpage and delamination from occurrence, such that the planarity of the die carrier is assured and solder balls can be precisely secured to the die carrier in position.

16 Claims, 2 Drawing Sheets

METHOD OF MANUFACTURING SEMICONDUCTOR PACKAGES AND A CLAMPING DEVICE FOR MANUFACTURING A SEMICONDUCTOR PACKAGE

FIELD OF THE INVENTION

The present invention relates to a method of manufacturing semiconductor packages and to a clamping device for manufacturing a semiconductor package, and more particularly, to a method of manufacturing semiconductor packages using a jig fixture comprising a submold and to a clamping device for manufacturing a semiconductor package in a mold.

BACKGROUND OF THE INVENTION

Ball grid array (BGA) semiconductor package is characterized in having a plurality of solder balls formed on a back side of a substrate, the solder balls serving as input/output (I/O) connections for electrically connecting a semiconductor die mounted on a front side of the substrate to an external printed circuit board (PCB). The BGA semiconductor package can beneficially accommodate more I/O connections, such that a semiconductor die formed with more electronic circuits and components is more suitably incorporated in the BGA package than a conventional leadframe-based package. As a result, the BGA semiconductor package has become the mainstream packaging technology for use in the electronic products requiring high processing speed and small size.

In order to lower the manufacturing cost, the BGA packages are generally fabricated in a batch-type manner. The batch-type method comprises the following steps. First, a matrix substrate strip is prepared comprising a plurality of substrate units. Then a die-bonding process is performed to mount at least one semiconductor die on each of the substrate units via an adhesive, and a curing process is carried out to firmly attach the semiconductor dies to the substrate units. A wire-bonding process is performed to electrically connect the semiconductor dies and the corresponding substrate units via bonding wires. Subsequently, a molding process is implemented to form an encapsulation body that encapsulates the dies and bonding wires. Finally, a plurality of solder balls are implanted on the substrate units, and a singulation process is conducted to separate apart the plurality of substrate units so as to form a plurality of individual BGA packages.

During the curing process for securing the attachment between the semiconductor dies and the substrate units, the substrate strip mounted with semiconductor dies is placed in and clamped by a jig fixture, and then heated in an oven. The jig fixture comprises a top mold and a bottom mold. The bottom mold is formed with a cavity therein. The top mold is engaged with the bottom mold to clamp the peripheral portion of the substrate strip, allowing the semiconductor dies disposed on the central portion of the substrate strip to be evenly heated.

The semiconductor dies are made of highly pure silicon, having a small coefficient of thermal expansion (CTE) of about 3 ppm/° C. The matrix substrate strip is mostly made of glass fiber, FR-4 resin, polyimide resin or epoxy resin, whose CTE is between 18 ppm/° C. to 50 ppm/° C. When heated to high temperature during the curing process, the substrate strip would suffer greater thermal stresses, making the substrate strip lose its planarity and deformed or warped, which may lead to delamination between the semiconductor dies and the substrate units or even cracks of the dies thereby degrading the quality of the fabricated packages.

If the above semiconductor packages are applied to a high-end electronic product such as digital camera or laser printer, a flexible substrate or thin substrate having certain flexibility should be used as the die carrier. However, such a die carrier usually has poor rigidity and provides weak support such that it tends to suffer serious warpage during the curing process especially that the central portion of the substrate mounted with the semiconductor die is suspended in the mold cavity and would thus be more severely warped. The warped die carrier losing its planarity makes it difficult to precisely position the solder balls on the die carrier during a self-alignment stage of the ball-implanting process, and also makes the bonding strength between the solder balls and the die carrier degraded. Moreover, during subsequent tests, the solder balls implanted on the warped die carrier would not be all in perfect contact with the contacts in a test machine, thereby adversely affecting the reliability of the test results.

Furthermore, if the semi-fabricated packages comprising the substrate strip and the semiconductor dies mounted on the substrate strip are changed in size for example using differently sized dies and/or substrate strip, it needs to prepare various jig fixtures that are sized in accordance with the size change of the semi-fabricated packages, which not only makes the fabrication processes complicated but also increases the fabrication cost. The above fabrication method cannot be performed in a cost-effective manner using the currently available equipment or a universal jig fixture, which is thus hardly popularized in the industry.

Therefore, the problem to be solved here is to provide an improved method of manufacturing semiconductor packages to be able to avoid the above drawbacks.

SUMMARY OF THE INVENTION

A primary objective of the present invention is to provide a method of manufacturing BGA semiconductor packages and a jig fixture for the method, so as to avoid warpage and delamination of semi-fabricated packages and prevent die cracks during curing.

Another objective of the present invention is to provide a method of manufacturing BGA semiconductor packages and a jig fixture for the method, which can secure the planarity of a substrate such that solder balls can be well bonded to the substrate and tests conducted by contacting the solder balls can yield reliable results.

A further objective of the present invention is to provide a method of manufacturing BGA semiconductor packages and a jig fixture for the method, whereby the jig fixture is universal for differently sized packages by using a replaceable suitably-sized submold of the jig fixture such that the manufacturing processes can be simplified and the production cost can be reduced.

In accordance with the above and other objectives, the present invention proposes a method of manufacturing BGA semiconductor packages. The method comprises the steps of: providing a die carrier, the die carrier having a front side and a back side, wherein the front side is defined with a plurality of substrate units thereon, and applying an adhesive on the substrate units to mount at least one semiconductor die to each of the substrate units and on the front side of the die carrier via the adhesive; placing and securing the die carrier in a jig fixture, the jig fixture comprising a submold and at least one exhaust passage communicated with an external exhauster, wherein the submold has a flat top surface and a plurality of exhaust holes extending through the submold and communicated with the exhaust passage, and drawing air in the jig fixture out of the jig fixture through the exhaust holes and the exhaust passage to form a negative-pressure environment in the jig fixture during a curing process; after curing, electrically connecting the semiconductor dies to the die carrier via a plurality of bonding wires; forming an encapsulation body to encapsulate the semiconductor dies and the bonding wires; attaching a plurality of solder balls to the back side of the die carrier; and singulating the die carrier to separate apart the plurality of substrate units to form a plurality of individual semiconductor packages.

A characteristic feature of the present invention is the use of the submold that is replaceable in the jig fixture. Since the submold has the plurality of exhaust holes extending therethrough, the substrate strip is placed in an upside-down manner that the dies abut the top surface of the submold. The external exhauster is actuated to draw air from the cavity through the exhaust holes and the exhaust passage to outside of the jig fixture, such that a negative-pressure environment is formed in the cavity. The negative-pressure environment produces an attraction force at the submold to allow the dies securely abut the top surface of the submold, and the attraction force is sufficient to counteract thermal stresses generated in the substrate strip under the high temperature during the curing process, thereby making the substrate strip have good planarity and preventing die cracking, warpage and delamination from occurrence. Moreover, the substrate strip having good planarity allows the solder balls to be precisely positioned on the substrate strip, and these solder balls can be well in contact with contacts in a test machine to yield reliable test results during subsequent electrical tests.

Furthermore, since the submold is replaceable, if the size of the substrate strip and/or dies is changed, the submold can be replaced with another suitably-sized submold in accordance with the size change of the substrate strip and/or dies, to allow the substrate strip and dies to be comfortably disposed in the cavity without having to prepare a new jig fixture. This thereby simplifies the fabrication processes and also reduces the fabrication cost, making the semiconductor packages more time- and cost-effective to fabricate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

FIGS. 1A–1F show the procedural steps for a method of manufacturing semiconductor packages proposed in the present invention.

Figure 1A:
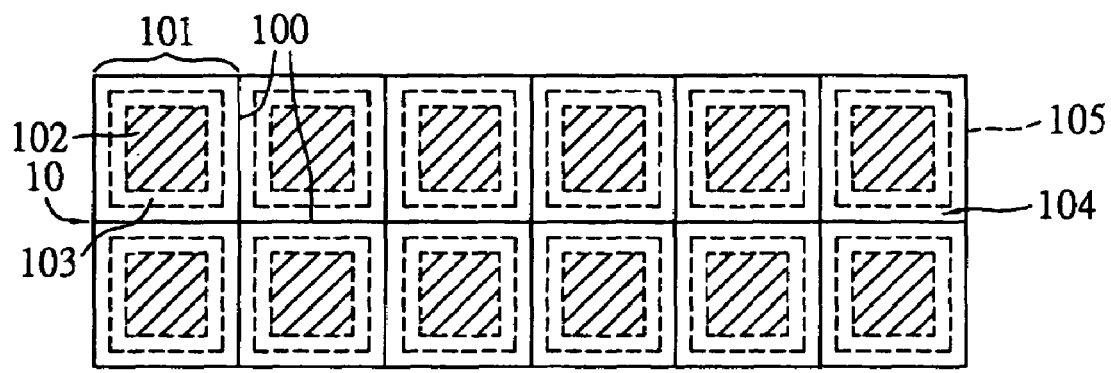
FIGS. 1A–1F are schematic diagrams showing the procedural steps for a method of manufacturing semiconductor packages in accordance with the present invention.

Referring first to FIG. 1A, a matrix substrate strip 10 serving as a die carrier is prepared having a front side 104 and a back side 105. The front side 104 is defined with a plurality of substrate units 101 bordered by dividing lines 100 thereon. In this embodiment, for example, the substrate strip 10 comprises twelve substrate units 101 arranged in a 2×6 matrix. Each of the substrate units 101 is defined with a die attach area 102 for accommodating a semiconductor die (not shown) thereon, and a conducting area 103 around the die attach area 102 with a plurality of conductive traces (not shown) formed on the conducting area 103, wherein a plurality of vias (not shown) are formed through the substrate strip 10 to electrically connect the conductive traces to a plurality of bond pads (not shown) on the back side 105 of the substrate strip 10. The substrate strip 10 may be made of a plastic material such as epoxy resin, glass fiber, polyimide resin or FR-4 resin, or a ceramic or glass material. Preferably the substrate strip 10 is made of the plastic material, which is beneficially cost-effective to fabricate and good for processing.

Figure 1B:
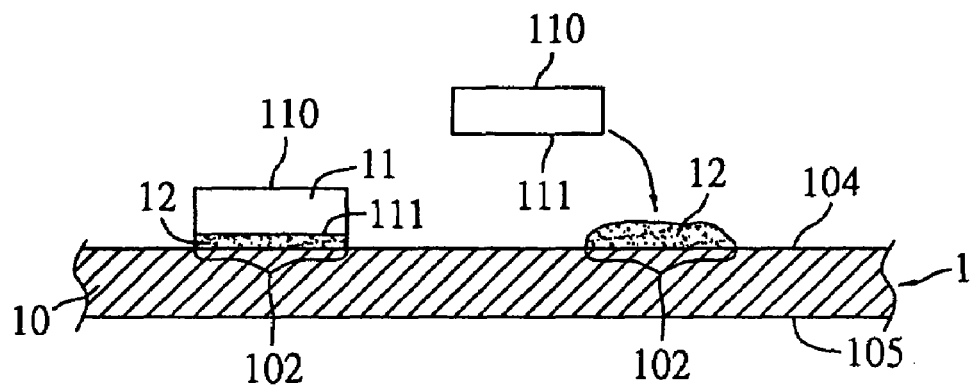

Referring to FIG. 1B, a plurality of semiconductor dies 11 are prepared each having a first surface 110 and a second surface 111. A thermally conductive adhesive 12 is applied on the die attach area 102 of each of the substrate units 101 to mount the second surface 111 of at least one of the semiconductor dies 11 to the die attach area 102 of each of the substrate units 101 and on the front side 104 of the substrate strip 10. Then the substrate strip 10 mounted with the dies 11 is placed into a clamping device such as jig fixture 13 (FIG. 1C) to undergo a curing process.

Figure 1C:
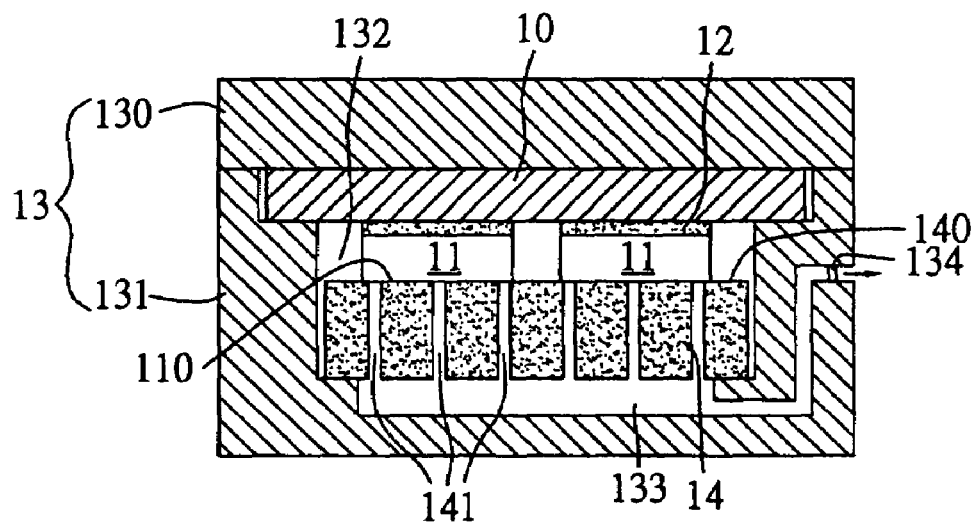

Referring to FIG. 1C, the jig fixture 13 comprises a top mold 130 and a bottom mold 131 engaged with the top mold 130. The bottom mold 131 is formed with a cavity 132 for receiving a submold 14 and the dies 11, and at least one exhaust passage 133 communicated with an external exhauster such as vacuum pump (not shown). The submold 14 is a replaceable member having a flat top surface 140 and a plurality of exhaust holes 141 extending through the submold 14 and communicated with the cavity 132. The exhaust passage 133 has two opposite end portions, wherein one end portion is connected to the exhaust holes 141, and the other end portion extends to a mini-valve 134 on the bottom mold 131 to be connected to the external exhauster. When the substrate strip 10 mounted with the dies 11 is placed in the jig fixture 13 in an upside down manner with the first surfaces 110 of the dies 10 abutting on the top surface 140 of the submold 14, the top mold 130 is engaged with the bottom mold 131 to firmly clamps the substrate strip 10 therebetween, and the external exhauster is actuated to open the mini-valve 134. As a result, air in the cavity 132 is drawn through the exhaust holes 141 and the exhaust passages 133 to outside of the jig fixture 13, thereby forming a negative-pressure environment in the cavity 132 such that a reverse attraction force is produced at the top surface 140 of the submold 14 to attract the combined substrate strip 10 and dies 11 to the top surface 140. The attraction force is sufficient to counteract thermal stresses produced in the substrate strip 10 under the high temperature during the curing process, making the first surfaces 110 of the dies 10 securely abut the top surface 140 of the submold 14, and thereby preventing warpage and delamination in the combined structure of the substrate strip 10 and dies 11 and cracks of the dies 11 from occurrence.

Figure 1D:
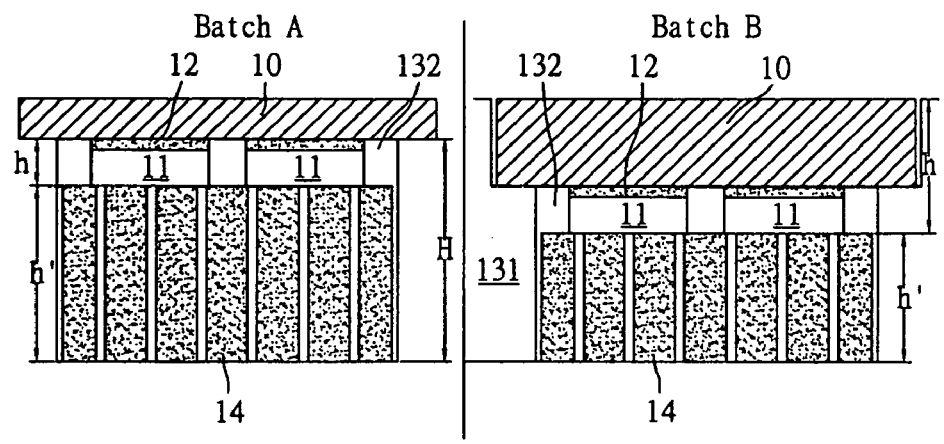
Figure 1E:
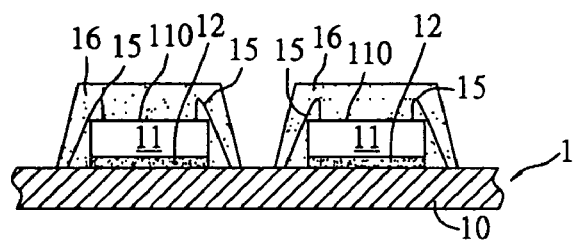

Referring to FIG. 1D, the combined structure of the substrate strip 10 and dies 11 (hereinafter referred to as "semi-fabricated packages") however may vary in height h if the size or type of the substrate strip 10 or dies 11 is changed. To ensure the first surfaces 110 of the dies 11 firmly abutting the top surface 140 of the submold 14, the height H of the cavity 132 of the lower mold 131 should tolerate the change of the height h of the semi-fabricated packages. This can be achieved through the use of the replaceable submold 14. When a batch A of semi-fabricated packages in the jig fixture 13 complete the curing process and are removed from the jig fixture 13, and the jig fixture 13 is ready for another batch B of semi-fabricated packages to be cured, if the batch B packages have different size from the batch A packages, it can simply replace the submold 14 used for the batch A packages with another suitably-sized submold 14 to allow the batch B packages to be comfortably placed in the fixed-sized cavity 132 of the jig fixture 13 without having to prepare a new jig fixture. Thereby, the fabrication cost would be effectively reduced as no need to prepare a plurality of differently sized jig fixtures, and the fabrication processes can be simplified as not having to change the whole jig fixture, making the curing process more time-effectively to proceed.

Figure 1F:
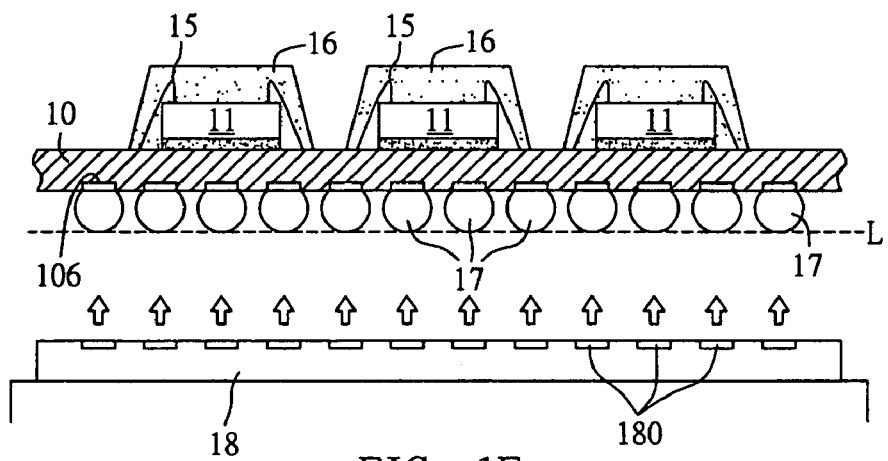

When the curing process is complete, the external exhauster is stopped, and the cavity 132 returns to normal air pressure such that the mini-valve 134 can be closed and the semi-fabricated packages can be removed from the jig fixture 13. Then referring to FIG. 1E, a wire-bonding process is performed to form a plurality of bonding wires 15 such as gold wires that are bonded to the first surfaces 110 of the dies 11 and the corresponding substrate units 101. After that, a molding process is carried out to form an encapsulation body 16 on each of the substrate units 101 to encapsulate the die 11 and bonding wires 15. Referring to FIG. 1F, a ball-implanting process is conducted to implant a plurality of solder balls 17 at the bond pads 106 on the back side 105 of the substrate strip 10. Since the substrate strip 10 not suffering warpage during curing can have excellent planarity, the solder balls 17 can be precisely secured to the corresponding bond pads 106 in position during the self-alignment stage of the ball-implanting process, and the solder balls 17 bonded to the substrate strip 10 also have good planarity forming a plane L by the bottoms of the solder balls 17. Consequently, the plane L allows perfect contact between the contacts 180 in a test machine 18 and the solder balls 17 to perform electrical tests, such that the test results are reliable.

Finally, a singulation process is performed to cut through the substrate strip 10 along the dividing lines 100 (shown in FIG. 1A) to separate apart the twelve (2×6) substrate units 101 so as to form twelve individual BGA semiconductor packages.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of manufacturing semiconductor packages, comprising the steps of:
   providing a die carrier, the die carrier having a front side and a back side and comprising a plurality of substrate units, and applying an adhesive on the substrate units to mount at least one semiconductor die to each of the substrate units and on the front side of the die carrier via the adhesive;
   placing and securing the die carrier in a jig fixture, the jig fixture comprising a submold and at least one exhaust passage communicated with the outside of the jig fixture, and drawing air in the jig fixture through the exhaust passage to the outside of the jig fixture to form a negative-pressure environment in the jig fixture during a curing process;
   electrically connecting the semiconductor dies to the die carrier via a plurality of first conductive elements;
   forming an encapsulation body to encapsulate the semiconductor dies and the first conductive elements;
   attaching a plurality of second conductive elements to the back side of the die carrier; and
   singulating the die carrier to separate apart the plurality of substrate units.

2. The method as claimed in claim 1, wherein the die carrier is a matrix substrate strip comprising the plurality of substrate units.

3. The method as claimed in claim 1, wherein the adhesive is a thermally conductive adhesive.

4. The method as claimed in claim 1, wherein the jig fixture comprises a top mold and a bottom mold, and the bottom mold is formed with a cavity for accommodating the submold and the semiconductor dies.

5. The method as claimed in claim 1, wherein the submold is replaceable.

6. The method as claimed in claim 1, wherein the submold has a top surface and a plurality of exhaust holes extending through the submold.

7. The method as claimed in claim 6, wherein the die carrier is placed in the jig fixture in an upside-down manner that the semiconductor dies abut the top surface of the submold.

8. The method as claimed in claim 6, wherein the exhaust passage has two end portions, with one end portion communicated with the exhaust holes and the other end portion connected to a mini-valve on the jig fixture to be in communication with the outside of the jig fixture.

9. The method as claimed in claim 1, wherein the first conductive elements are gold wires.

10. The method as claimed in claim 1, wherein the second conductive elements are solder balls.

11. The method as claimed in claim 10, wherein the semiconductor packages are BGA (Ball Grid Array) semiconductor packages.

12. A clamping device for manufacturing a semiconductor package in a mold, comprising:
    a top mold;
    a bottom mold to be engaged with the top mold, the bottom mold having a cavity;
    a submold received in the cavity of the bottom mold; and
    at least one exhaust passage formed in the lower mold and communicated with the outside of the clamping device, for allowing air in the cavity to be drawn out of clamping device through the exhaust passage to form a negative-pressure environment in the cavity.

13. The clamping device as claimed in claim 12, wherein the clamping device is a jig fixture.

14. The clamping device as claimed in claim 12, wherein the submold is replaceable.

15. The clamping device as claimed in claim 12, wherein the submold has a top surface and a plurality of exhaust holes extending through the submold and communicated with the cavity.

16. The clamping device as claimed in claim 15, wherein the exhaust passage has two end portions, with one end portion communicated with the exhaust holes and the other end portion connected to a mini-valve formed on the clamping device to be in communication with the outside of the clamping device.

* * * * *